(12) United States Patent
Han et al.

(10) Patent No.: US 6,778,435 B1
(45) Date of Patent: Aug. 17, 2004

(54) MEMORY ARCHITECTURE FOR TCCT-BASED MEMORY CELLS

(75) Inventors: Jin-Man Han, Santa Clara, CA (US); Farid Nemati, Menlo Park, CA (US); Seong-Ook Jeong, Cupertino, CA (US)

(73) Assignee: T-Ram, Inc., San Jose, CA (US)

( * ) Notice: Subject to any disclaimer, the term of this patent is extended or adjusted under 35 U.S.C. 154(b) by 0 days.

(21) Appl. No.: 10/170,816

(22) Filed: Jun. 12, 2002

(51) Int. Cl.$^7$ ............................................. G11C 11/34
(52) U.S. Cl. ........................ 365/174; 365/148; 365/149
(58) Field of Search ................................ 365/174, 148, 365/149

(56) References Cited

U.S. PATENT DOCUMENTS 6,229,161 B1    5/2001  Nemati et al.
6,492,662 B2 * 12/2002  Hsu et al. .................... 257/124

OTHER PUBLICATIONS

Hirose, T. et al. "A 20-ns 4-Mb CMOS SRAM with Hierarchial Word Decoding Architecture," IEEE Journal of Solid-State Circuits, Oct. 1990, pp. 1068–1074, vol. 25, No. 5, IEEE.

Noda, K., et al., "A Boosted Dual Word–Line Decoding Scheme for 256Mb DRAMs," IEEE Symposium on VLSI Circuits Digest of Technical Papers, 1992, pp. 112–113, 11–4, IEEE.

Sugibayashi, T., et al., "WP 3.5: A 30ns 256 Mb DRAM with Multi-Divided Array Structure," IEEE International Solid-State Circuits Conference, Feb. 24, 1993, pp. 50–51 et seq., IEEE.

Hiroshige, H. et al., "2–V/100–ns 1T/1C Nonvolatile Ferroelectric Memory Architecture with Bitline–Driven Read Scheme and Nonrelaxation Reference Cell," IEEE Journal of Solid–State Circuits, May 1997, pp. 649–654, vol. 32, No. 5, IEEE.

* cited by examiner

*Primary Examiner*—Hoai Ho

(57) ABSTRACT

A memory architecture especially adapted to provide an architecture to house one or more TCCT-based memory cells and to provide a reference signal. The memory architecture is designed to effectively resolve stored information from memory cells into logical values, such as logical "0" and "1." An exemplary memory architecture includes a data block that comprises a first set of one or more bit lines, where a word line one line extends to a first subset of the first set of the one or more bit lines. The data block also includes a word line two line extending to a second subset of the first set of the one or more bit lines. A memory cell is coupled to the word line one line, the word line two line and a common bit line of the first and second subsets of bit lines.

7 Claims, 11 Drawing Sheets

MEMORY ARCHITECTURE FOR TCCT-BASED MEMORY CELLS

BACKGROUND OF THE INVENTION

1. Field of the Invention

The present invention relates generally to integrated circuits, and in particular, to a memory architecture for facilitating storage and access of data in memory cells, such as in thinly capacitively-coupled thyristor ("TCCT") based memory cells.

2. Description of Related Art

Random Access Memories ("RAM") are memories capable of multiple read-write cycles and are widely used to temporally store data in computing applications. A typical RAM is structured to include numerous memory cells arranged in an array of rows and columns wherein each memory cell is designed to store a datum or unit of data as a binary digit (i.e., a binary zero or a binary one). Each row of the memory cell array is typically connected to a word line and each column of the memory cell array is typically connected to a bit line (or a pair of complementary bit lines in an SRAM-based memory). The typical RAM structure also includes other circuitry to effect traditional read and write operations, such as reference signal generation circuitry, signal sensing circuitry, and control signal circuitry.

Reference signal generation circuitry is designed to provide a reference in which to compare a data signal (e.g., voltage or current) representing the unit of data stored in a memory cell. Depending on the memory cell, the reference signal can be a complementary signal, such as in an SRAM device, or an independently derived reference signal, such as in a DRAM device. Independently derived reference signals are generated by memory cells known as reference cells, where reference cells are well known for providing a reliable and accurate reference signal (e.g., reference voltage or current) in which to compare the data signal.

The term "device" herein is used to describe both a discrete semiconductor circuit element, such as a MOS transistor or a TCCT device, as well as a semiconductor product. A memory semiconductor product can be referred as a memory "chip" or "integrated circuit ("IC")" and is a circuit element operating cooperatively with other semiconductor products, such as a microprocessor.

Signal sensing circuitry is employed to sense whether the value of the voltage or current representing the unit of data is a logical one or zero. A typical signal sensing circuit is a sense amplifier operating as a differential amplifier. Sense amplifiers ("sense amps" or "SAs") are designed to receive the reference signal and the data signal, and thereafter, resolve the data signal into a logical one or zero. Control signal circuitry includes read and write signals to effect such functions and more specifically includes memory address decoding signals, and other signals such as a write driver select control signal.

Not only do RAM memory cells, reference cells and/or sense amplifiers each influence memory architecture design, but three primary design considerations also govern the design thereof. These primary considerations are circuit space, power consumption, and speed, each of which are traditionally traded-off or emphasized at the expense of the others. Such considerations are predominantly governed by the structure and layout of the constituent memory cells, such as SRAM, DRAM and T-RAM cells.

FIGS. 1A and 1B schematically show an SRAM-based memory cell and a DRAM-based memory cell, respectively. FIG. 1A is a general schematic of a typical SRAM memory cell composed of metal oxide semiconductor ("MOS") devices A, B in a cross-coupled arrangement with a pair of bit lines ("BL"). Devices A are pass transistors designed to operate when an appropriate word line ("WL") signal is applied to the transistor gates. In particular, devices A operate as switches to provide stored data from each cell to one of complementary pair of bit lines BL and $BL_{bar}$. Devices L are resistors or pull-up transistors to provide appropriate loads to offset charge leakage from the storage transistors represented as devices B. Devices B of FIG. 1A are storage devices designed to store information as a binary data bit. In a read operation, the word line activates devices A and the SRAM cell provides a stored voltage from a drain of each device B to its respective bit line.

Conventional SRAM chips often employ memory architectures that emphasize two of these primary design considerations at the expense of a third. For example, FIG. 1A is a schematic representation of a conventional SRAM based on a six-transistor ("6T") cell (i.e., two transistors and two resistors plus two cell-access transistors). In another conventional SRAM cell, referred to as a four-transistor ("4T") SRAM cell (not shown), the cell includes four cross-coupled transistors. Such cells are compatible with mainstream CMOS technology, consume relatively low levels of standby power, operate at low voltage levels, and perform at relatively high speeds. Conventional 4T and 6T SRAM cells, however, use a large cell area and thus significantly limit the maximum density of such SRAM cells in an array. Consequently, traditional SRAM memory architectures typically are designed to leverage their high speed and low power characteristics at the cost of additional layout area.

FIG. 1B is a general schematic of a typical DRAM memory cell that includes a MOS device C including a gate connected to a single word line (i.e., row) to enable the cell to store a voltage representing a data bit of information on capacitor CAP. Bit line BL (i.e., column) is used to read data from or to write data to the DRAM cell.

Conventional DRAM chips also employ memory architectures that compromise trade-offs between the three primary design considerations discussed above. DRAM devices, in contrast to SRAM devices, are generally fabricated in arrays with higher densities (i.e., memory cells per unit area) of DRAM cells than SRAM arrays because the individual memory cells of a DRAM include fewer transistors than the individual cells of an SRAM. DRAM cells, unlike SRAM cells, must be periodically refreshed to prevent loss of data. To refresh DRAM cells, additional charge is added to bit lines in a DRAM architecture. The additional charge and bit line capacitance, however, causes read and write operations with DRAM cells to execute at lower speeds than in SRAM memory architectures. Consequently, DRAM memory architectures are designed to provide high cell densities at the expense of speed.

FIG. 1C is a TCCT memory cell as described in U.S. Pat. No. 6,229,161, which is issued to Nemati et al. ("the Nemati patent") and incorporated herein by reference in its entirety for all purposes. A TCCT based memory cell, alternatively referred to as a T-RAM cell (i.e., Thyristor-RAM), has an "on" state wherein it generates a current to represent a logic "1" that is received by the bit line, and has an "off" state wherein it produces essentially no current to represent a logic "0." The TCCT memory cell generally is adapted to operate with two unique word lines—a first word line referred to as word line one ("WL1") and a second word line referred to as word line two ("WL2"), both of which include at least one line end referred to herein as a terminus. WL1 is coupled to the gate of access device S, where access device S provides access to storage cell T for transferring bit information between the TCCT memory cell T and the bit line during both read and write operations. WL2 is coupled to TCCT memory cell T and is typically activated only for writing data to the device.

In a proper cell write operation, however, both WL1 and WL2 are activated to transfer a data signal from the bit line to TCCT memory cell T for data storage. To write a logical "0" into TCCT cell T, a bit line voltage is raised to a relatively high potential, such as $V_{dd}$. Conversely, to write a logical "1," into TCCT cell T, a voltage having a relatively low potential (i.e., 0v or ground) is applied to the bit line. In both cases, WL2 is activated to accomplish writing both logical "0" and "1" into the TCCT memory cell T for storage.

It should be noted that if WL2 is enabled without WL1 enabled, such as during a write operation of another cell coupled to the same WL2, a TCCT device's latching state is most likely affected and thus the previously stored data bit is no longer reliable. In this event, WL1 provides no influence over or control in the write operation of TCCT devices and cannot influence this phenomenon. Therefore, the number of cells coupled to WL2 is a factor in determining an adequate architecture for TCCT-based memory arrays.

TCCT-based memory architectures and their constituent cells, such as the one illustrated in FIG. 1C, provide for the best qualities of both SRAM and DRAM technologies. In particular, TCCT-based memory arrays offer the speed of conventional SRAM-based memory arrays at a cell density equivalent to that achieved by DRAM architectures. Moreover, TCCT-based memory cells are well suited for manufacturing in traditional complementary metal oxide semiconductor ("CMOS") semiconductor process flows, thus providing for low power memory arrays without a need for complicated (i.e., expensive) semiconductor manufacturing processes.

The memory architectures and structures facilitating the use of the SRAM and DRAM memory cell technologies, however, are not well suited for implementing RAM arrays based on TCCT memory cells without compromising the above three primary design considerations. For example, a drawback to memory architectures using SRAM cells is that they require two bit line signals to provide complementary reference signals. TCCT-based memory arrays, in contrast, sufficiently operate in an open bit line architecture (i.e., higher cell density) because they do not generally require the use of a reference signal based on opposite states of the data stored in the TCCT cell as do SRAM cells. Another drawback to SRAM memory architectures is that they are designed to receive only one word line signal for use during either a read or a write operation and cannot readily accommodate TCCT-based memory cells and their multiple word lines (e.g., WL1 and WL2).

Conventional DRAM devices typically employ folded bit line architectures as illustrated in FIG. 2. In a folded bit line architecture, a single memory array includes memory cells arranged in rows and columns where a memory cell is located at every other intersection of a word line (e.g., $W_0$ through $W_N$) with a bit line, where the bit lines are arranged in complementary bit line pairs, such as $Bit_0$ and $Bit_{Obar}$. Two rows of reference cells are also included in the array and are addressed through the Ref and $Ref_{bar}$ word lines. A first row of reference cells addressable by Ref word line is associated with the $Bit_0$ through $Bit_N$ bit lines, and a second row of reference cells addressable by the $Ref_{bar}$ word line is associated with complementary bit lines $Bit_{Obar}$ through $Bit_{Nbar}$. A sense amplifier is coupled to each pair of complementary bit lines for resolving into valid logic levels the voltages developed at one bit line by a memory cell in view of another voltage developed on another bit line by a reference cell.

One of the drawbacks to the folded bit line architecture is that it typically consumes more chip "real estate" or die layout area than an open bit line architecture because each alternating intersection 20 does not have a memory cell, as shown in FIG. 2. Another drawback to the folded bit line architecture used by DRAM devices is that it cannot be readily adapted to include TCCT-based memory cells without relaxing the feature size of the TCCT memory cell (i.e., increasing the cell pitch) to include an additional word line. Relaxing a TCCT memory cell would thus increase its size to about twice its optimized size even without configuring the TCCT cell's word line one and word line two of FIG. 1C to a folded bit line scheme. In yet another drawback to DRAM memory architectures is that they too are designed to receive only one word line signal for use during either a read or a write operation and thus do not readily accommodate TCCT-based memory cells.

A memory architecture capable of using TCCT-based memory cells where the architecture is designed to accommodate other circuitry, such as reference cells and sense amplifiers is a necessity. Such a memory architecture would provide the benefits of each of SRAM and DRAM architectures without the drawbacks described above and other inherent disadvantages of conventional memory architectures. In particular, there is a need for a memory architecture for providing a structure to house TCCT-based memory cells, to provide reference signals and to effectively sense and resolve stored information into a logical value, such as a logical "0" or "1," while optimizing each of the primary design considerations of circuit space, power consumption, and speed.

SUMMARY OF THE INVENTION

The present invention provides a unique memory architecture especially adapted for TCCT-based memory cells. In accordance with a specific embodiment of the present invention, a memory data block includes a first set of bit lines and a one WL2 line extending to a subset of the first set of bit lines. Such a data block also includes one WL2 driver coupled to the one WL2 line, where the one WL2 driver resides adjacent to the first set of bit lines. Furthermore, a memory cell is located at an intersection of a bit line of the subset of one WL2 lines. In another embodiment, the memory cell is a TCCT-based cell. At least one WL1 line extending to the subset of the first set of one or more bit lines. In yet another embodiment, the data block includes at least one WL1 driver coupled to the at least one WL1 line, the at least one WL1 driver residing adjacent to the first set of one or more bit lines.

DESCRIPTION OF SPECIFIC EMBODIMENTS

Detailed descriptions of the embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure, method, process or manner.

Word lines (and associated drivers) as described herein, such as word line one and word line two, each operate to effectuate read and write functions as are typically performed in conventional memories (e.g., DRAM or SRAM) with a single word line. An "array" denotes herein a structure including one or more rows and one or more columns forming at least one intersection, where a cell (e.g., TCCT-based memory cell) resides at the intersection and can store a bit. A "data block" as described herein is an array structure and is determined by the minimum number of cells per bit line and the cells coupled to a single word line (i.e., word line two). A "bank" is a group of data blocks wherein only one data block is generally accessed for each read or write operation and is an internal logic segment of memory.

In accordance to a specific embodiment of the present invention, an exemplary memory architecture is designed by first considering the functionality of the word line two ("WL2") lines and drivers and how best to implement these drivers. For example, each WL2 in an array can be coupled to multiple TCCT memory cells (i.e., two or more) at their respective anodes for increased cell density (i.e., decrease chip real estate) at the expense of decreasing accessibility to individual cells.

In the above-described configuration, the number of cells per layout area is increased over a structure that otherwise requires specific WL2 lines to access each individual cell. However, cells cannot be individually access to write data into one specific cell of interest since WL2 is coupled to multiple cells. When WL2 is enabled to write data to a particular cell (i.e., associated with an enabled WL1), the data previously stored in the other TCCT cells (i.e., not associated with an enabled WL1) coupled to the same enabled WL2 cannot be relied upon to remain in the same logical state as prior to enabling WL2. This is primarily due to the nature of TCCT memory cells in which the TCCT device's latching state may likely be reversed, thus rendering the previously stored data unreliable.

Figure 1A:
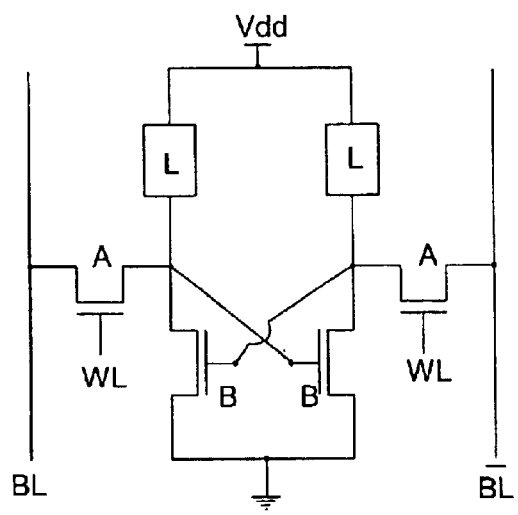
FIG. 1A illustrates a conventional SRAM cell.
Figure 1B:
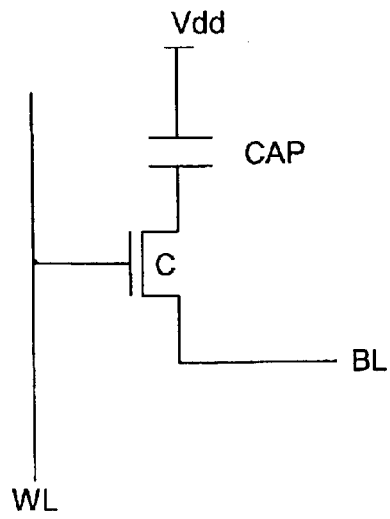
FIG. 1B is a schematic representation of a conventional DRAM cell.
Figure 1C:
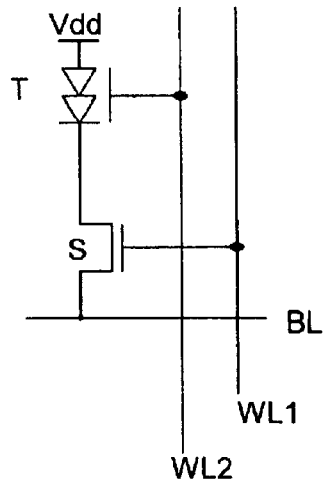
FIG. 1C illustrates a TCCT-based memory cell.
Figure 2:
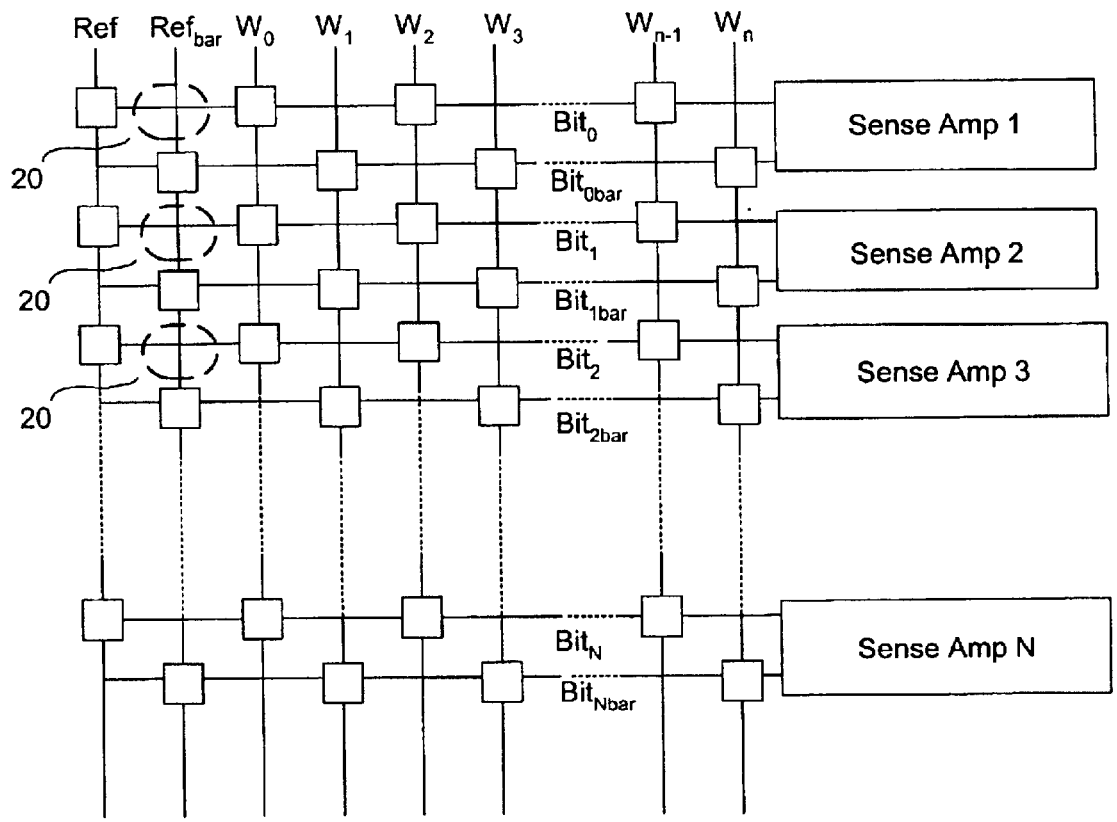
FIG. 2 is a block diagram of a conventional folded bit architecture.
Figure 3:
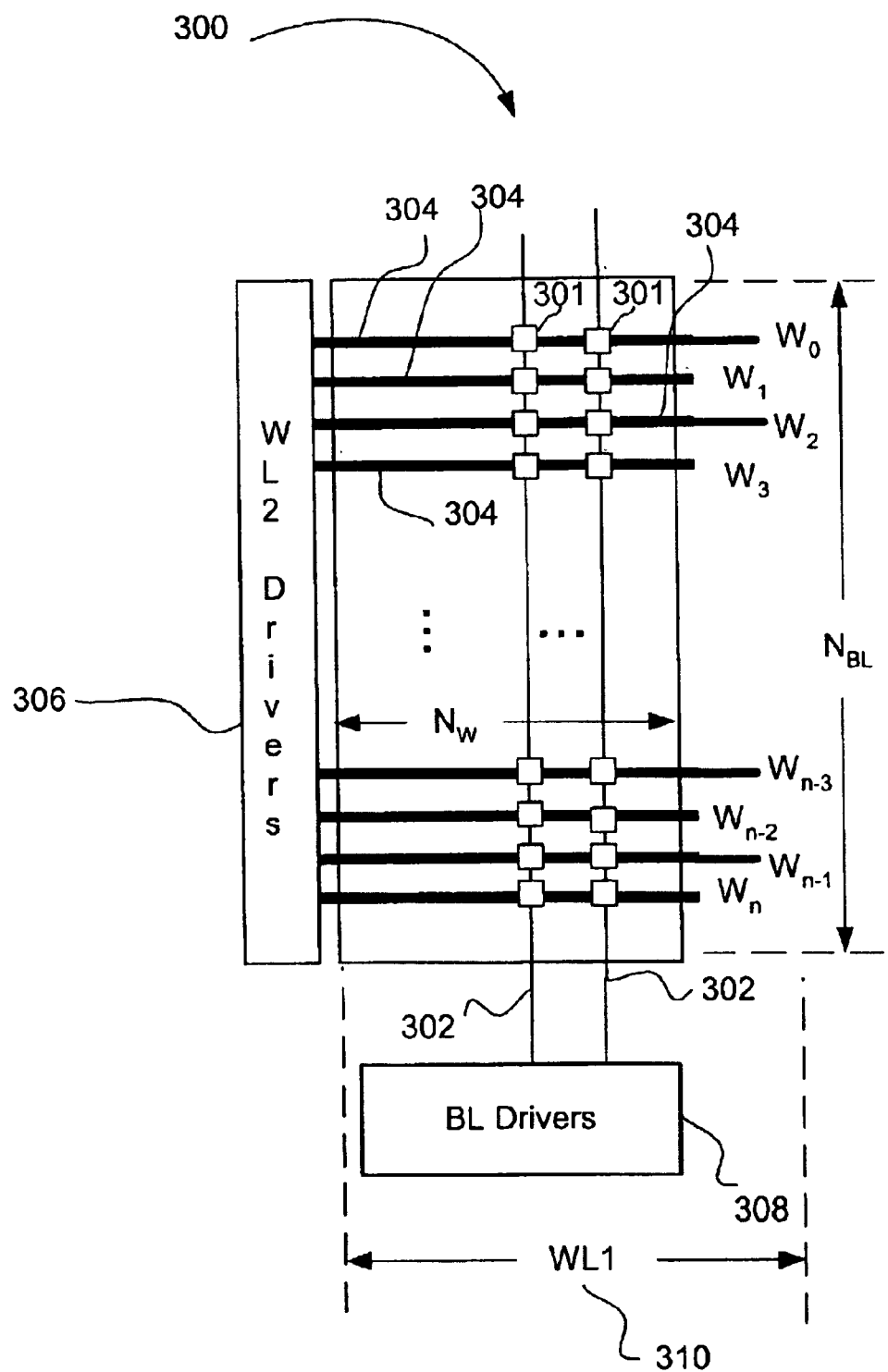
FIG. 3 is a block diagram of a block of WL2 drivers for illustrating data block design considerations.

In determining an optimized number of associated TCCT memory cells for each WL2 line, a WL2 driver is configured to provide an enabling signal to the optimized number of cells. FIG. 3 illustrates an exemplary placement of WL2 drivers for driving respective WL2s in accordance to one embodiment of the present invention. The number of cells per WL2 driver is defined in part by the word size of the application or intended use of a memory device including a TCCT-based memory array. That is, the number of memory cells coupled by a single WL2 line is a factor in determining the word size of the memory device as well as the number of WL2 drivers required to control the access to each of the cells.

As shown in FIG. 3, the number of cells connected to a single WL2 driver can be expressed as a word size ("$N_W$") where the word size is a group of data bits regarded as a whole while programming or transferring data. Although a word is often eight, sixteen, thirty-two, sixty-four bits in length, or it can be any number of bits. $N_W$ is generally determined by its particular application, such as providing memory for a microprocessor operating in a very long instruction word ("VLIW") computer architecture, and thus sets a minimum array structure for a memory architecture according to an embodiment of the present invention. Selecting an appropriate number $N_W$ requires optimizing layout utilization and signal propagation delay, among other things. As $N_W$ increases, fewer WL2 drivers are needed, thus conserving chip real estate. Signal propagation delay when writing data into or reading data from a memory cell, however, increases as $N_W$ increases. One having ordinary skill in the art of circuit design will recognize how to determine appropriate values of $N_W$ that are suitable to practice the present invention by considering, for example, the memory application.

A minimum array structure described herein is referred to as a data block 300 and is determined by the number of cells 301 connected to a bit line 302 ($N_{BL}$) and a number $N_W$ of cells connected to a single WL2 304. An exemplary value of $N_{BL}$ is typically 256 or 512. Further to this example, if $N_W$ is 32 and $N_{BL}$ is 512, data block 300 has a size of 16 kb where 1 k is equivalent to 1,024 bits. In operation, data block 300 includes bit line driver 308 configured to read data from memory cell 301 via bit line 302 and to drive write data into memory cell 301 via bit line 302 as selected by a specific word line two 304. Moreover, read and write operations can be distributed over multiple data blocks 300. For example, if an array includes four data blocks 300 that can be activated simultaneously with each data block having a word size $N_w$ of 32 bits, then the resulting total word size for the four data blocks is 128 bits. By dividing the array into smaller units of data blocks, the signal integrity is enhanced (i.e., in part due to decreased line capacitance) with minimal increase in layout area such that the read and write speeds of divided arrays is faster than if a single data block was designed to have a word size $N_w$ of 128 bits.

According to another embodiment of the present invention, data block 300 is configured to simultaneously write to $N_w$ cells associated with WL2 when selected during a write operation. For example, in one architectural design of a TCCT-based array, the array includes 256 memory cells coupled to each WL2. When a particular WL2 is enabled, each of the 256 cells associated with the particular WL2 can be written to simultaneously. Due to the nature of TCCT memory cells and the effects of WL2 thereon when enabled, during write operations the stored data in each of the TCCT cells may be corrupted and thus rendered unreliable. It should be noted in a read operation, however, corruption of other cells associated with a WL1 does not occur when word line one (WL1) is enabled (so long WL2 is not selected) to selectively transfer cell signals representing stored data to selected data buses.

In an exemplary application suitable for implementing TCCT memory arrays, a video memory for video graphic accelerator operations includes at least one memory device having a TCCT memory array. This video memory is designed to function as a single-ported synchronous graphics RAM ("SGRAM") device known in the art, where SGRAM devices are predominately used to effectuate video graphic displays, such a three-dimensional video technology. Video graphics generation requires extremely fast clearing, especially in generating three-dimensional image displays. SGRAM devices accomplish this by employing a "block-write" feature that quickly fills a display screen (i.e. by reading data) and allows fast memory clearing (i.e., by writing data). TCCT-based memory arrays are well suited to function as SGRAM devices in implementing a block write command.

Figure 4:
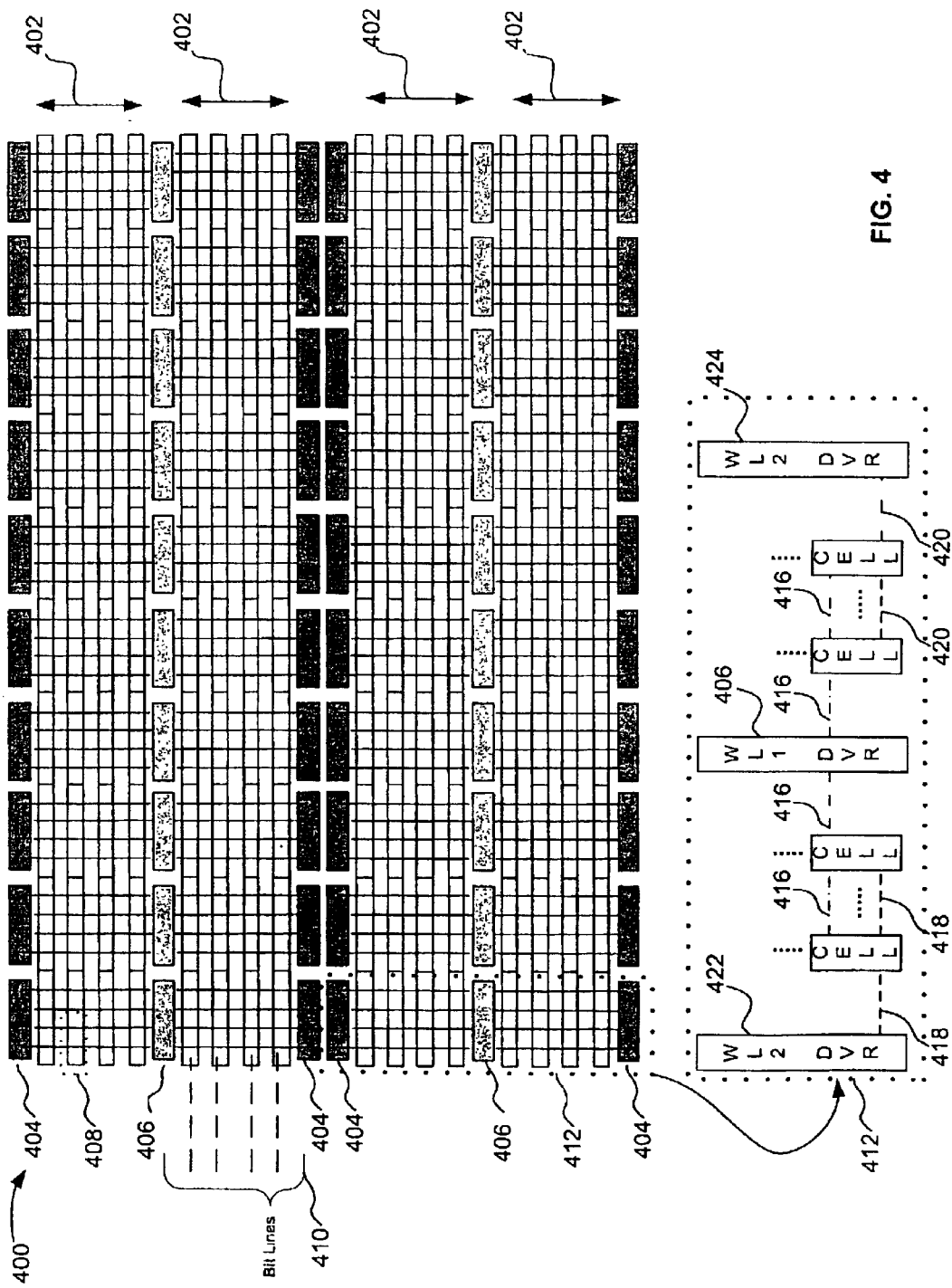
FIG. 4 is a graphical representation of a memory array in accordance to a specific embodiment of the present invention.

FIG. 4 depicts an exemplary array 400 in accordance with a specific embodiment. Array 400 comprises four data blocks 402, each having a similar structure and functionality as data block 300 of FIG. 3 in view of the above-mentioned design considerations (e.g., $N_w$). In this instance, each data block 402 is designed at an $N_w$ of 4 (i.e., four TCCT memory cells per WL2 driver) and at an $N_{BL}$ of 20 (i.e., twenty WL2 lines for reading data from and writing data to individual cells). Array 400 of FIG. 4, therefore, includes a total of 320 memory cells 408 in four data blocks 402, each data block 402 having 20 WL2 drivers (In this example, two word line drivers are represented by each word line two driver group 404). Array 400 is designed to share WL1 406 drivers between at least two data blocks 402 to, among other things, conserve layout area and to relax layout pitch. WL2 driver group 404, however, are not shared between data blocks 402 to reduce the number of memory cells affected by enabling a WL2 line during a write operation.

FIG. 4 also shows an exemplary array portion 412 of array 400 oriented 90 degrees from its original placement to more clearly illustrate an architecture where a single WL1 driver 406 is shared between two data blocks. WL1 416 couples at least one memory cell in each of the data blocks to WL1 driver 406. Each of the cells associated with WL1 416 do not, however, share the same association with a WL2 418. For example, WL2 418 is shown to couple one or more memory cells in one data block to WL2 driver 422. Similarly, another WL2 420 is shown to couple one or more memory cells in another data block to WL2 driver 424.

Figure 5:
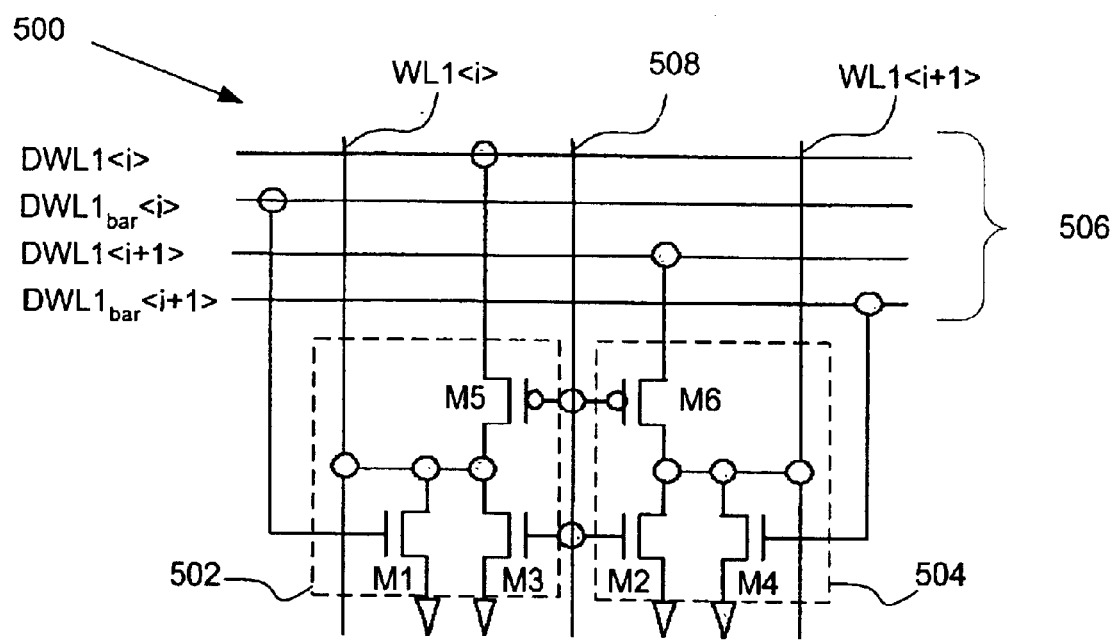
FIG. 5 is a schematic representation of an exemplary WL1 driver circuit.

FIG. 5 is a schematic of a WL1 driver circuit 500 for implementing one or more WL1 drivers 406 of FIG. 4 in accordance to an embodiment of the present invention. Exemplary WL1 driver circuit 500 of FIG. 5 is shown to include two WL1 drivers: WL1<i> driver 502 and WL1<i+1> driver 504. Each WL1<i> driver 502 and WL1<i+1> driver 504 is coupled to at least one of driver control signals 506 and global WL1 driver select signal ("GWL1$_{bar}$ <k>") 508.

WL1<i> driver 502 comprises switching devices that when selected by the global WL1 driver select signal 508 and its associated driver control signals, the associated WL1 is enabled. As shown in FIG. 5, MOSFET devices M1, M3 and M5 are exemplary switching devices coupled to driver control and global WL1 driver select signals. In particular, MOSFET M1 is an NMOS transistor having its gate coupled to one driver control signal decode DWL1$_{bar}$ <i>, its drain coupled to WL1<i> and its source coupled to a predetermined potential, such as ground. MOSFET M3 is also an NMOS transistor having a gate coupled to global WL1 driver select signal GWL1$_{bar}$ <k> 508, a drain coupled to WL1<i> and a source coupled to the predetermined potential. MOSFET M5 is a PMOS transistor having a gate coupled to global WL1 driver select signal GWL1$_{bar}$ <k> 508, a drain coupled to WL1<i> and a source coupled to another driver control signal decode DWL1<i>.

Driver control signals DWL1$_{bar}$<i> and DWL1<i> are signals decoded by, for example, a column decoder as is known in the art of memory design. A typical column decoder primarily functions to decode a logical address corresponding to one or more memory cells in which data is written to and read from by using decoded signals. In this instance, signals DWL1$_{bar}$<i> and DWL1<i> are complementary such that when DWL1<i> is at one logic level (e.g., "1"), DWL1$_{bar}$<i> is at another logic level (e.g., "0").

Moreover, DWL1$_{bar}$ signals (e.g., DWL1bar<i>, DWL1$_{bar}$<i+1>, DWL1$_{bar}$<i+2>, etc.) are related to decoded data block address information so that each specific DWL1$_{bar}$ signal is dedicated to select an associated WL1 line associated with the decoded address. Consequently, the DWL1$_{bar}$ signals also select a data block in which the particular memory cell being addressed is located.

In operation of WL1<i> driver 502, GWL1$_{bar}$<k> 508 and DWL1$_{bar}$<i> are driven to their active states or levels (i.e., are asserted low) and complementary signal DWL1<i> is driven to its active state (i.e., is asserted high). In particular, when GWL1$_{bar}$<k> 508 and DWL1$_{bar}$<i> are each in a low state, device M1 is off and device M5 is on. Thus, word line WL1<i> is coupled to DWL1<i>, which is in a high state, such at Vdd. With word line WL1<i> at Vdd, the associate pass transistor is activated to allow a unit of data to flow from the memory cell to a bit line.

When WL1<i> driver 502 is selected, WL1<i+1> driver 504 is non-selected by applying opposite logical states to DWL1$_{bar}$<i+1> and DWL1<i+1>, respectively, to disable WL1<i+1>. That is, DWL1$_{bar}$<i+1> is driven to a high voltage level while DWL1<i+1> is driven to a low voltage level. It should be noted that WL1<i+1> driver is disabled regardless of the state of GWL1$_{bar}$<k> 508. With these conditions, each WL1 associated with a non-selected memory cell has a low voltage level applied to its pass transistor, thus preventing that cell from coupling to its bit line. Furthermore, other global WL1 driver select signals (e.g., GWL1$_{bar}$<k+1>, GWL1$_{bar}$<k+2>, ... GWL1$_{bar}$<k+n>) are generally in a high state to disable other WL1 drivers other than WL1 drivers 502, 504, regardless of the state of the corresponding driver control signals. It should be noted that in this instance, WL1 driver 504 operates similarly to the above-described functionality of word line one driver 502.

Although WL1 driver circuit 500 includes two WL1 drivers, circuit 500 can be designed to include any number of WL1 drivers. In another embodiment of the present invention, global WL1 driver select signals can couple to two or more WL1 drivers 406 of FIG. 4 over one or more data blocks. That is, for each value of "i," any number of WL1 drivers in one or more data blocks can be selected by a single global WL1 driver select signal.

One having ordinary skill in the art should appreciate that WL1 driver circuit 500 of FIG. 5 can be manufactured by way of other known semiconductor techniques and technologies. For example, each of the above switching devices can be made from bipolar junction transistors (BJT) or other known technologies. All variables, such as "k," "l," "i," "j," "n" and other letters represent a predetermined number of items in a specific embodiment that can be selected, for example by a designer. One having ordinary skill in the art should appreciate that any equivalent circuit for selecting memory cells having two word lines, such as TCCT cells, are within the scope and the spirit of the present invention.

Figure 6:
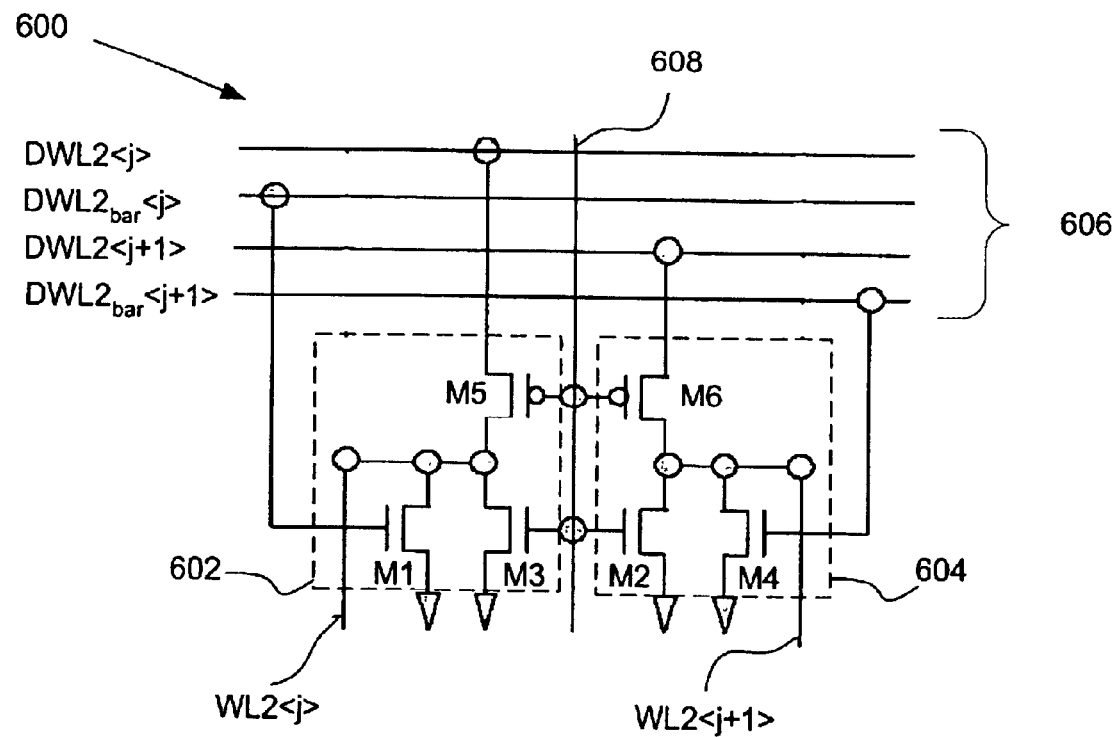
FIG. 6 is a schematic representation of an exemplary WL2 driver circuit.

FIG. 6 is a schematic of a WL2 driver circuit 600 for implementing one or more WL2 drivers 404 of FIG. 4 in accordance to one specific embodiment of the present invention. Exemplary WL2 driver circuit 600 of FIG. 6 is shown to include two WL2 drivers shown as: WL2<j> driver 602 and WL2<j+1> driver 604. Moreover, WL2<j> driver 602 and WL2<j+1> driver 604 are coupled to at least one of driver control signals 606 and global WL2 driver select signal ("GWL2$_{bar}$<k>") 608. FIG. 6 depicts word lines WL2<j> and WL2<j+1> extending from the respective WL2 drivers 602 and 604 in one direction only to represent an embodiment where the WL2 drivers 602, 604 are associated with only one adjacent data block as determined, in part, by the above-described design considerations. Otherwise, WL2 driver circuit 600 of FIG. 6 is similar in structure and functionality to WL1 driver circuit 500 of FIG. 5.

Figure 7:
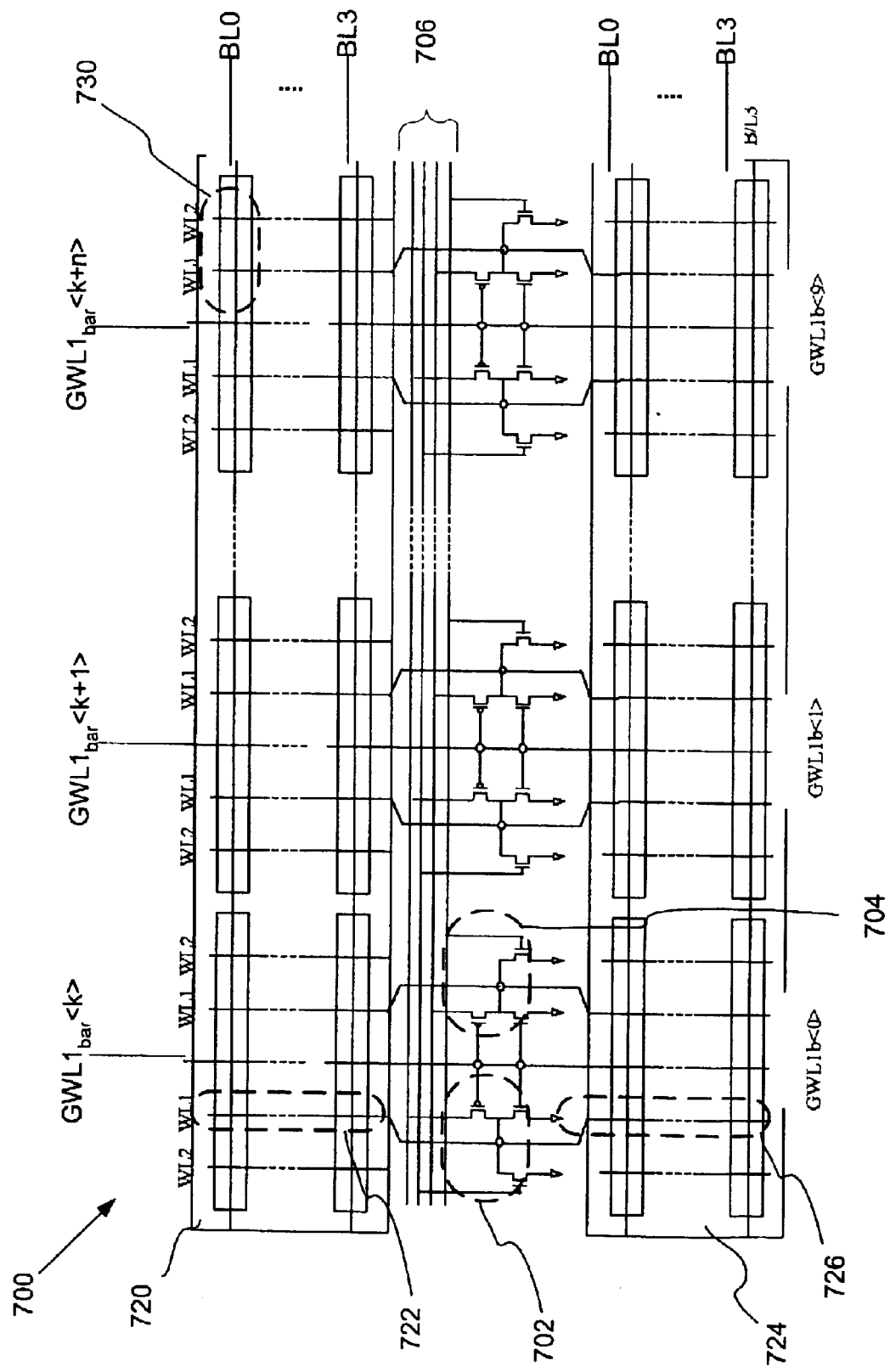
FIG. 7 is a schematic diagram of WL1 drivers in an exemplary array portion in accordance to an embodiment of the present invention.

FIG. 7 shows a portion 700 of an array in accordance to one embodiment of the present invention. Array portion 700 includes two data blocks 720 and 724 associated with one or more WL1 drivers, such as WL1 drivers 702 and 704, without inclusion of any WL2 drivers for clarity. WL1 drivers 702 and 704 are similar in structure and functionality to WL1 drivers 502 and 504 of FIG. 5. Exemplary data blocks 720 and 724 each include a number of bit lines, such as bit line <0> ("BL0") though bit line <3> ("BL3"), to convey data to and from the memory cells, such as cell 730, to effect writing and reading therewith. Although each data block 720, 724 is shown to have four bit lines, the data blocks can have any suitable number of bit lines to practice the present invention. Moreover, array portion 700 also includes a number of global WL1 driver select signals GWL1$_{bar}$<k>, GWL1$_{bar}$<k+1>, . . . GWL1$_{bar}$<k+n> and driver control signals 706, such as DWL1$_{bar}$<i> and DWL1<i> of FIG. 5, for selecting (i.e., enabling) a specific WL1 driver (e.g., WL1 driver 702 or 704).

A shown in FIG. 7, WL1 drivers 702 and 704 reside between data blocks 720 and 724 with WL1s 722 and 726 extending therethrough to respectively service memory cells (e.g., TCCT memory cells) therein. As described above, one having ordinary skill in the art should appreciate that WL1 drivers 702 and 704 can be designed to select cells 730 in any number of data blocks, where the number is determined, in part, by factors such as speed of WL1 selection time, layout area, and other known design parameters.

Figure 8:
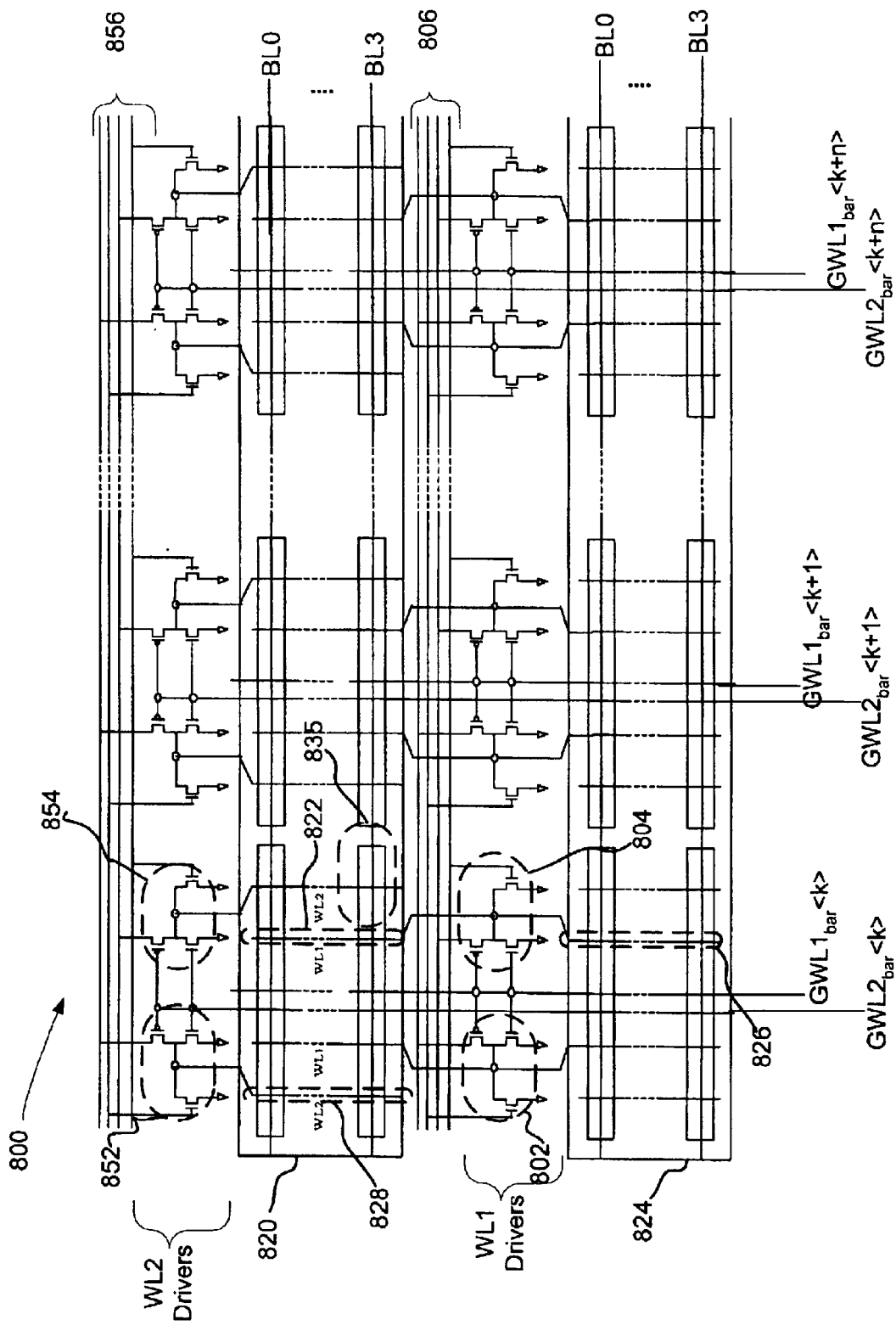
FIG. 8 is a schematic diagram of WL1 and two drivers in an array portion in accordance to another embodiment of the present invention.

FIG. 8 shows another exemplary portion 800 of an array in accordance to a specific embodiment of the present invention. Array portion 800 includes two data blocks 820 and 824 associated with one or more WL1 drivers, such as WL1 drivers 802 and 804. Moreover, array portion 800 includes one or more WL2 drivers, such as WL2 drivers 852 and 854. WL1 drivers 802 and 804 and WL2 drivers 852 and 854 are respectively similar in structure and functionality to WL1 drivers 502 and 504 of FIG. 5 and WL2 drivers 602 and 604 of FIG. 6. Exemplary data blocks 820 and 824 each include a number of bit lines, such as bit line <0> ("BL0") though bit line <3> ("BL3"), to convey data to and from the memory cells, such as cell 835, to effect writing and reading therewith. Although each data block 820, 824 is shown to have four bit lines, the data blocks shown here or described anywhere herein can have any suitable number of bit lines to practice the present invention.

Array portion 800 includes a number of global WL1 driver select signals GWL1$_{bar}$<k>, GWL1$_{bar}$<k+1>, . . . GWL1$_{bar}$<k+n> and corresponding driver control signals 806, such as DWL1$_{bar}$<j> and DWL1<j> of FIG. 5, for selecting (i.e., enabling) a specific WL1 driver (e.g., WL1 driver 802 or 804). Also, portion 800 includes a number of global WL2 driver select signals GWL2$_{bar}$<k>, GWL2$_{bar}$<k+1>, . . . GWL2$_{bar}$<k+n> and corresponding driver control signals 856, such as DWL2$_{bar}$<j> and DWL2<j> of FIG. 6, each configured to select (i.e., enable) a specific WL2 driver (e.g., WL2 driver 852 or 854).

A shown in FIG. 8, WL1 drivers 802 and 804 reside between data blocks 820 and 824 with WL1s 822 and 826 extending therethrough (from word line one driver 804) to respectively service memory cells (e.g., TCCT memory cells) therein. In this instance, WL2 drivers 852 and 854 reside adjacent data block 820 with WL2 828 extending therethrough (from WL2 driver 852) to service memory cells (e.g., TCCT memory cells) in only data block 820. WL2 drivers 852 and 854 are similarly located with respect to data block 820 as WL2 driver 404 of FIG. 4. It should be noted that in this example, WL2 drivers 852 and 854 do not extend through data block 824 such that data block 824 is serviced by another WL2 driver, which can be located adjacent to data block 824. As described above, one having ordinary skill in the art should appreciate that WL1 drivers 802 and 804 and WL2 drivers 852 and 854 can be designed to select cells, such as cell 835, in any number of data blocks, where the number is determined, in part, by factors such as speed of WL1 selection time, layout area, and other well known design parameters.

As an example of the functionality of array portion 800 and its elements, consider initiation of a write operation involving memory cell 835. First, a logical address corresponding to cell 835 is decoded and driver control signals 806 (e.g., DWL1$_{bar}$<j> and DWL1<j>) enable WL1 driver 804 to allow data from BL<3> into cell 835. Similarly, driver control signals 856 (e.g., DWL2$_{bar}$<j> and DWL2<j>) enable WL2 driver 854 to provide for writing the data into cell 835. Both global WL1 driver select signal GWL1$_{bar}$<k> and global WL2 driver select signal GWL2$_{bar}$<k> are activated to permit WL1 driver 804 and WL2 driver 854, respectively, to operate. One having ordinary skill in the art should appreciate how to design a control mechanism to accomplish the above-described operations with the appropriate timing sequence of signals for array portion 800.

Figure 9:
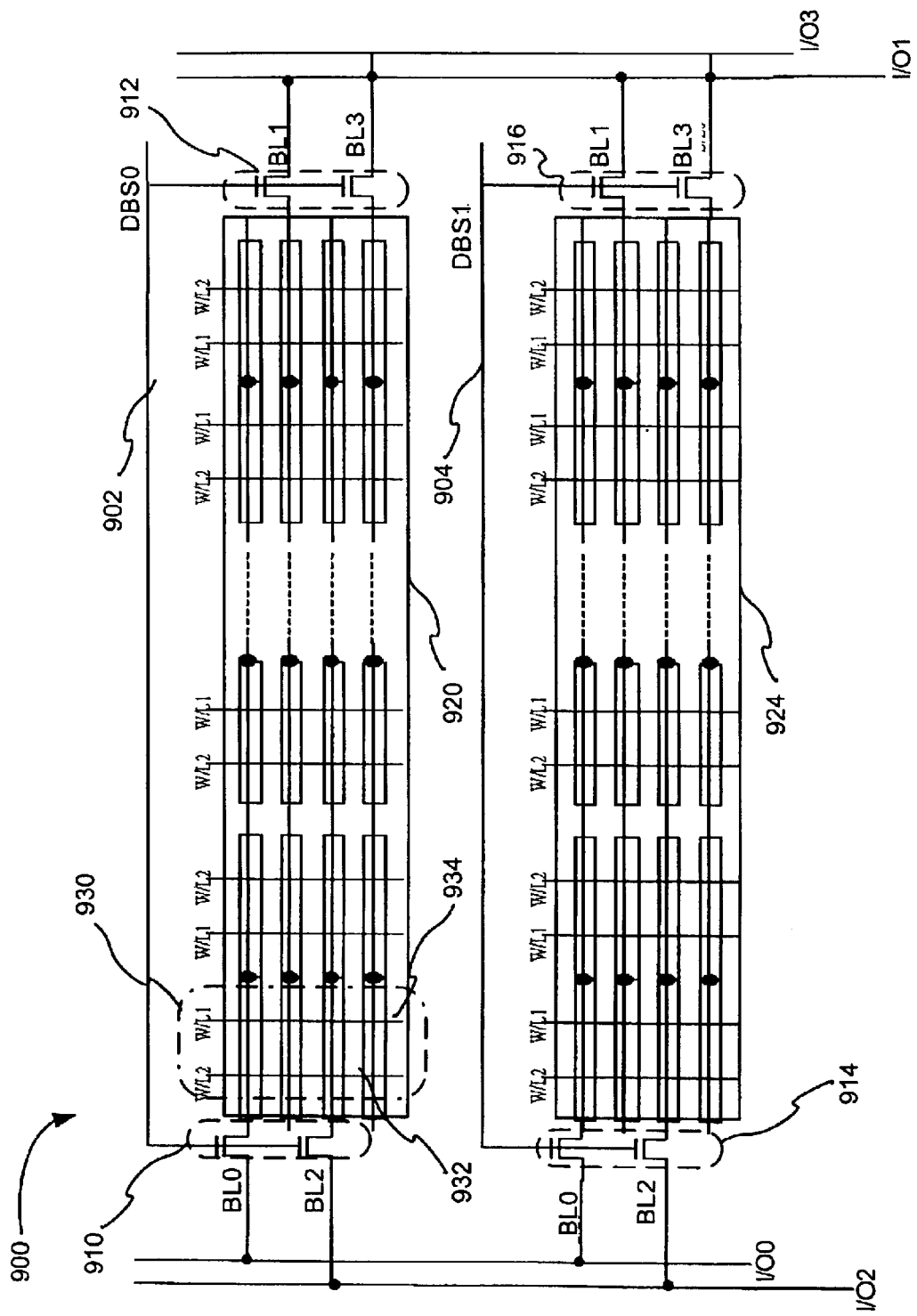
FIG. 9 illustrates exemplary data blocks coupled via data block switches to input/output lines.

FIG. 9 shows a portion 900 of an exemplary array having the bit lines coupled to common input/output ("I/O") lines, in accordance to one embodiment of the present invention. For clarity, WL1 and WL2 drivers as well as the associated driver control and global word line driver select signals are omitted. In this example, array portion 900 includes two data blocks 920, 924 having a number of bit lines (e.g., BL0 to BL3), where each bit line is configured to carry or transport data to and from associated input/output lines. In particular, bit lines BL0 to BL3 from each data blocks 920, 924 couple respectively to common input/output lines I/O0 to I/O3 via data block switches. Data block switches are designed to provide access between bit lines and common I/O lines when selected.

As shown in FIG. 9, two bit lines (i.e., BL0 and BL2) couple via data block switches 910, 914 to two common I/O lines (i.e., I/O0 and I/O2) on one side of data blocks 920, 924. The other two bit lines (i.e., BL1 and BL3) couple via data block switches 912, 916 to two common I/O lines (i.e., I/O1 and I/O3) on the other side of data blocks 920, 924. In this configuration, locating data block switches on both sides of the data blocks 920, 924 is optimized in terms of relaxed layout pitches (i.e., alternating sides saves chip real estate). It should be noted, however, other layout variations of array portion 900 are within the scope and spirit of the present invention. For example, all common I/Os and data switches can be located on the same side of the data block.

Data block switches 910, 912 are controlled by data block select signal zero ("DBS0") 902 to allow memory cell data corresponding to data block 920 to pass, via bit lines BL0 to BL3, to and from common I/O lines I/O0 to I/O3. In operation, for example, if memory cell 930 is subject to a write or a read operation, DBS0 is activated to enable data block switches 910 and 912 to allow data to pass between the bit and I/O lines, whereas DBS1 remains inactive. With DBS1 inactive, data block switches 914 and 916 are disabled thus preventing data from passing between the bit lines of data block 924 and the common I/O lines. Therefore, all bit lines belonging to a specific data block are accessed simultaneously due to the activation of the corresponding data block switches.

Figure 10:
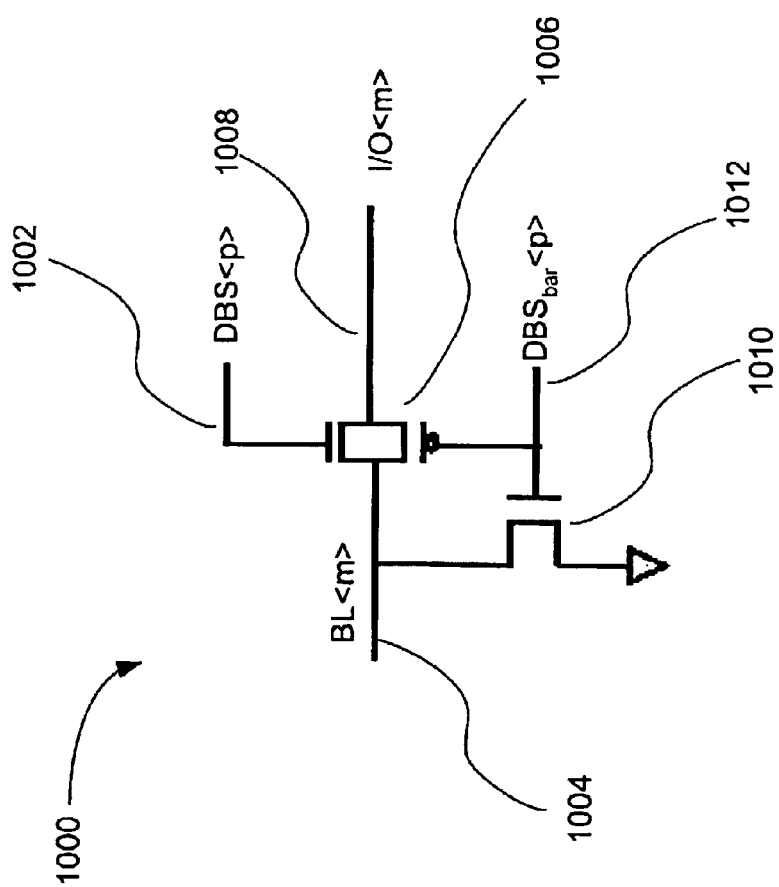
FIG. 10 is a schematic diagram of a data block switch in accordance to an embodiment of the present invention.

FIG. 10 is a schematic representation of a data block switch 1000 in accordance to one embodiment of the present invention. Exemplary data block switch 1000 includes a transmission gate 1006 comprising a PMOS transistor and an NMOS transistor as is known in the art. Transmission gate 1006 operates to govern the data flow between a specific BL<m> 1004 and a specific common I/O line <m> 1008 by activating data block switch signals DBS<p> and $DBS_{bar}$<p>.

Exemplary signals DBS<p> and $DBS_{bar}$<p> can be active in a logic high state and a logic low state, respectively, and are generated by any memory control circuit known in the art. As shown in FIG. 10, data block switch 1000 optionally includes pre-charge transistor 1010 to precharge bit line BL<m> 1004 to logic low (e.g., ground) when transmission gate 1006 is not selected. Pre-charge transistor 1010 alternatively, or concurrently, can serve as a holding current supplier for TCCT-based memory cells. In this instance, pre-charge transistor 1010 is a NMOS transistor having its source terminal coupled to a potential, such as ground, its drain coupled to bit line BL<m> 1004 and its gate to $DBS_{bar}$<p>.

Referring back to FIG. 9, exemplary array portion 900 depicts data block switches, such as switches 910 and 914, as single transistor switches. In accordance to another specific embodiment, each data block switch of FIG. 9 can be substituted with data block switch 1000 of FIG. 10.

Array portion 900 of FIG. 9 is configured to operate with centrally or globally generated reference signals to compare against the voltages and/or current levels read selected TCCT-based memory cells of interest. By comparing the level representing a value of a stored data signal to a reference, the data signal can be resolved into a reliable logic level, such as high or low. Thus, the data applied to I/O lines I/O0 to I/O3 can be compared to a reference level generated from array other than array portion 900.

In another embodiment, an unselected data block is used to provide reference signals. For example, if DBS0 is enabled to select data block 920 of array portion 900 during a read operation, data block 924 can be used to provide a reference signal. At a first point of time in the read operation, DBS1 is selected to transmit reference signals onto each of the I/O lines I/O0 to I/O3. Then, the reference signals are stored at one terminal of a corresponding sense amplifier where the storage means, for example, is a capacitor. At a second point of time in the same read operation, DBS1 is deselected and DBS0 is selected to turn on its associated data block switches to allow data stored in the memory cells to be transmitted across the bit lines and onto the I/O lines. Prior to this point in time, each I/O line is switched to a second terminal of a sense amplifier. Once the retrieved data signal from the I/O line stabilizes at the second sense amplifier terminal, a stored reference signal can be compared to the retrieved signal to resolve a corresponding logic level.

Figure 11:
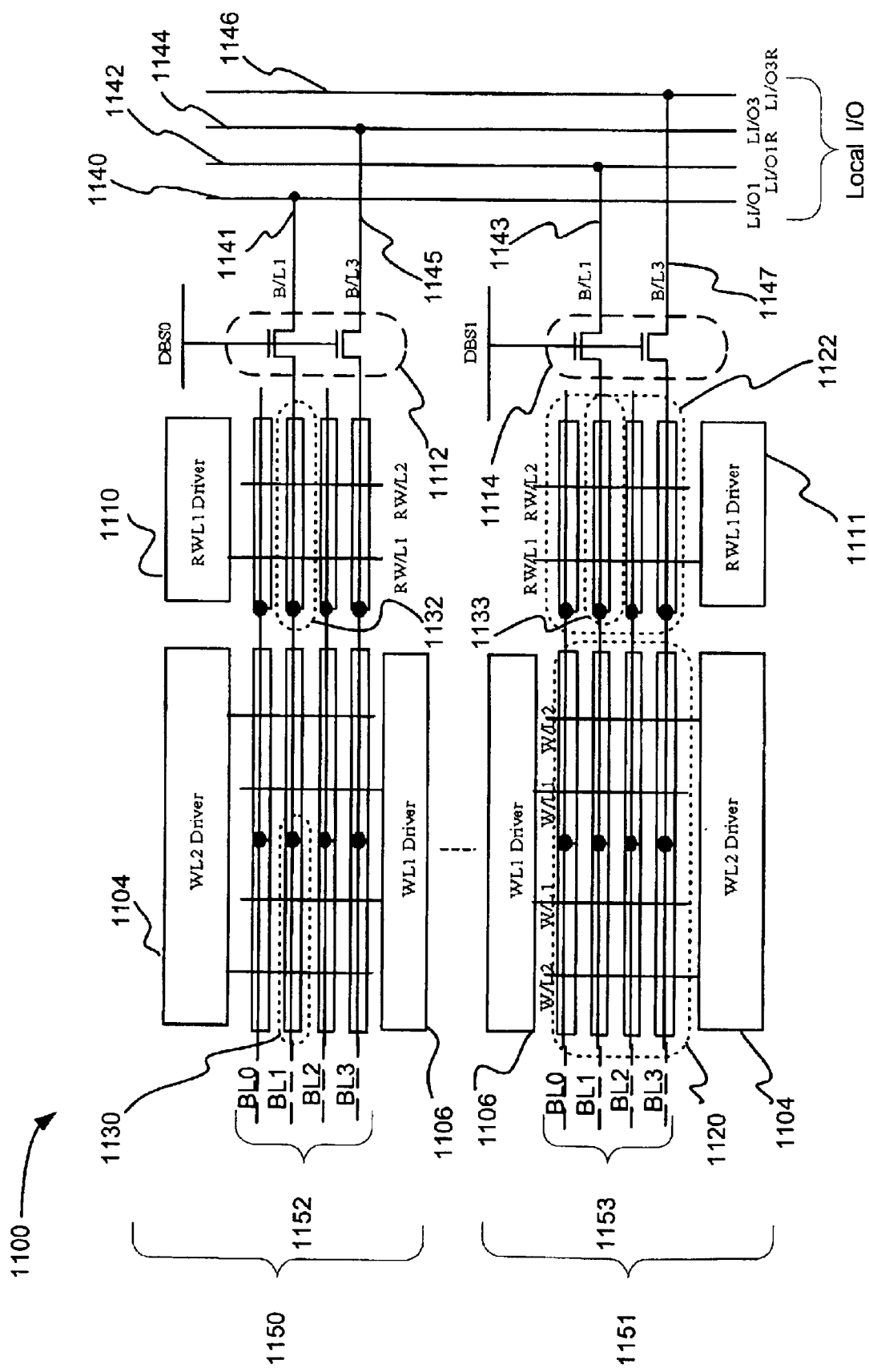
FIG. 11 is an illustration of an array portion including exemplary data blocks with reference cells.

FIG. 11 illustrates yet another array portion 1100 in accordance to yet another specific embodiment of the present invention where reference signals are generated either within the array portion 1100 or within an array in which portion 1100 resides. Although array portion 1100 excludes circuitry related to bit lines BL0 and BL2 for clarification purposes, it should be understood that the structure and functionality of the omitted bit lines are similar to that of BL1 and BL3 discussed below. By employing memory cells configured to be reference cells within array portion 1100 for generating reference signals, more reliable determinations of stored data can be achieved. The determinations are more reliable since TCCT-based memory cells within the same array generally have similar operating characteristics due to, among other factors, fewer variations in the manufacturing process between memory and reference cells in the same array.

In array portion 1100, additional I/O lines are dedicated to receiving reference signals generated by reference cells and are designated as lines for I/O reference signals ("LI/OR"). Array portion 1100 shows two independent data blocks 1150, 1151 where their independence is due to unique WL1 drivers 1106, WL2 drivers 1104 and reference word line one drivers ("RWL1") 1110. Moreover, bit lines BL1 1141 and BL3 1145 of the data block controlled by DBS0 ("DBS0 data block") do not share a local I/O line respectively with bit lines BL1 1143 and BL3 1147 of the data block controlled by DBS1 ("DBS1 data block"). In this example, bit lines BL1 1143 and BL3 1147 for data block 1151 provide reference signals to respective LI/OR1 1142 and LI/OR3 1146 lines. In one embodiment, reference cells 1122 are not coupled to a WL2 driver because the reference cells are used for read only operations.

In array portion 1100, data block 1151 (as well as data block 1150) includes memory cells 1120 associated with WL1 drivers 1106 and WL2 drivers 1104, and also includes reference cells 1122 associated with RWL1 drivers 1111. As illustrated with respect to the DBS0 data block 1150, each bit line is coupled to one or more memory cells 1130 and at least one reference cell 1132.

A suitable reference cell for use in practicing the present invention is disclosed in an patent application owned by a common assignee, T-RAM, Inc., entitled "Reference Cells for TCCT-Based Memory Cells," U.S. patent application Ser. No. 10/117,930, filed on Apr. 5, 2002, which is incorporated by reference for all purposes. Reference cell 1133 according to a specific embodiment, generates about half the current of memory cell 1130 when in a logical 1 state. For example, when data from cell 1130 generates a current of about 50 µA in a high state and about zero µA in a low state, whereas reference cell 1133 generates a current of about 25

μA to obtain an optimum signal margin. In this instance, a sense amplifier can detect a reliable signal margin regardless of whether cell 1130 is storing a logical 1 or a logical 0.

In operation, when a memory cell, such as cell 1130, in DBS0 data block 1150 contains data to be read, WL1 drivers 1106 are enabled to select cell 1130 and to read data stored thereon onto BL1. Also, DBS0 is activated to allow data block switches 1112 to convey the cell data from BL1 onto I/O line LI/O1. Furthermore, reference cell 1133 in DBS1 data block 1151 is configured to generate a reference signal and is enabled by its reference word line drivers 1111. Like DBS0, DBS1 is also activated to allow the reference signal generated by reference cell 1133 to transfer onto LI/OR1.

It should be noted that when DBS1 data block 1151 is to be used to provide a reference signal, the word line one and two word line drivers associated with the memory cells of the DBS1 data block are disabled by, for example, a driver control signals. Moreover, the word line one of reference cell 1132 ("RWL1") is separate from that of the word line one of cell 1130 ("WL1"). In this configuration, reference cell 1132 need not be coupled to a global word line select driver signal, as is the case for the TCCT-based memory cells 1130.

Figure 12:
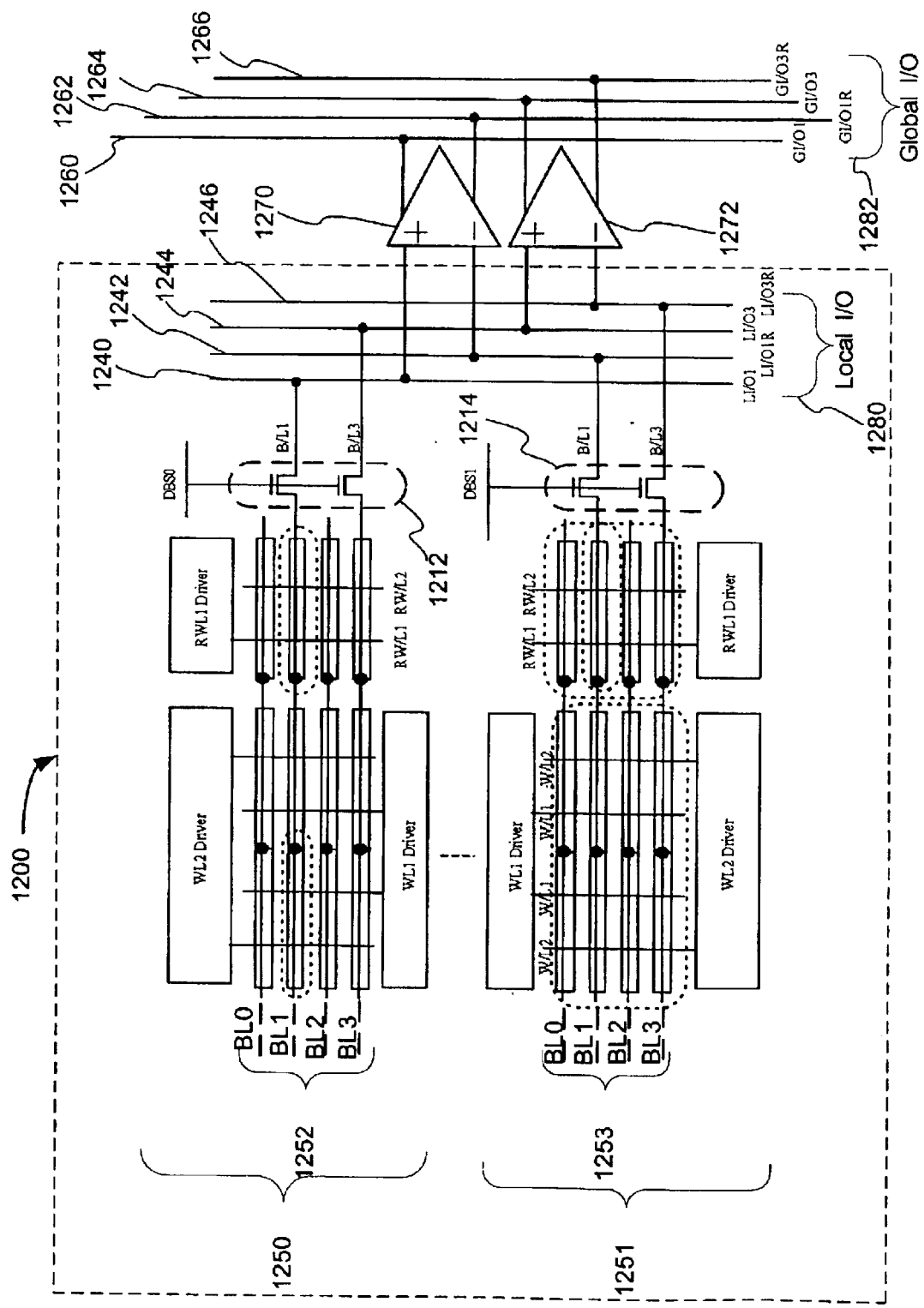
FIG. 12 is a graphical representation of an array portion including local sense amplifiers according to a specific embodiment of the present invention.

FIG. 12 illustrates another example of an array portion 1200 similar to array portion 1100 of FIG. 11 in accordance to still yet another specific embodiment of the present invention. In this instance, local sense amplifiers ("LSA") 1270, 1272 are coupled to array portion 1200 to locally resolve stored data states in specific TCCT-based memory cells. The local sense amplifiers, in part, operate to compare a data signal representing the value of a stored memory datum to a corresponding reference signal for resolving the data signal into a logical "0" or "1." One having ordinary skill in the art should appreciate that array portion 1200 can include more than the two data blocks shown in FIG. 12.

Generally the number of data blocks sharing one or more LSAs is determined, in part, by the layout size of each of the LSAs. The smallest number of data blocks that can share one or more LSAs is generally determined by the minimum layout pitch of an LSA. That is, as the spacing between bit lines decreases (i.e., higher bit line density), fewer LSAs can be implemented without detrimentally impacting the layout size of memory array 1200. The largest number of data blocks that can share one or more LSAs is determined, among other things, by the number of data blocks accessed during each read operation. For example, if a memory bank is defined to include a specific number of data blocks, "s," wherein only one data block is accessed per operation, then s number of data blocks is the largest number of data blocks necessary to share the LSAs. In particular, where one data block includes BL0–BL3 for providing data signals in an array that only selects one data block (in a memory bank) for a read or write operation, then the largest number of LSAs required is four (i.e., one for each bit line). However, if two data blocks are selected to provide data signals, then the largest number of LSAs required is eight since the number of data signals requiring resolution (i.e., determining logical state of data) is doubled.

Generally, the number of signals "n" determines the number of local sense amplifiers coupled to one or more data blocks. For example, when an exemplary data block is designed with $N_w$=n, then n LSAs are typically required to read n data signals. Since, however, the layout size of a local sense amplifier is relatively much larger than the layout pitch of the bit lines (i.e., the spacing between bit lines), using n LSAs generally consumes more layout area than is desired.

One approach, in accordance to a specific embodiment, provides shared or multiplexed LSAs between multiple bit lines within a single data block. Sharing an LSA within a data block, however, is a less desirable alternative unless the read word size is designed smaller than the write word size. With the same word size for both the read and write operations, all cell data within a selected data block should be read using LSAs.

Array portion 1200 of FIG. 12 is coupled to two local sense amplifiers ("LSA"), where exemplary local sense amplifiers LSA1 1270 and LSA3 1272 are differential sense amplifiers and operate as is known in the art. LSA1 1270 and LSA3 1272 are coupled between local I/O signal lines 1280 and global I/O signal lines 1282. As shown, one input (e.g., positive input) of LSA1 1270 is coupled to receive one or more data signals representing data values stored in TCCT-based memory cells via I/O1 1240. Another input (e.g., negative input) of LSA1 1270 is coupled to receive one or more reference signals LIO1R 1242.

Additionally, one output of LSA1 1270 is coupled to bit line one global I/O GI/O1 1260 and another output is coupled to reference bit line one global I/O GI/O1 R1262, where the LSA1 outputs can provide complementary signals to global I/O lines 1282. Consequently, the one or more bit lines 1252 each of which is associated with a respective data block, such as data block 1250 (i.e., controlled by DBS0) are multiplexed by data block switches 1212 to at least one local I/O line 1280. Likewise, reference signals generated at data block 1251 are also multiplexed between one or more data blocks by DBS I data block switches 1214.

In accordance with this embodiment, a local sense amplifier (LSA) can be located relatively close to the bit lines for amplifying typically small differential signals received from array portion 1200. The local sense amplifiers also function to isolate the relatively high capacitive global I/O lines 1282 from the bit lines (e.g., BL0–BL3). Local I/O lines 1280, under the control of column decoders (not shown), operate to convey data signals from the bit lines via the local sense amplifiers and onto global I/O lines. One having ordinary skill in the art should appreciate that any number of LSAs can be used, such as one to four, depending on the design. Moreover, a single LSA can be coupled to a multiplexer to receive any number of multiplexed data or reference signals.

In yet another embodiment, the array portion 1200 and the associated LSAs are adapted to reverse the polarity of the LSA's inputs if the reference signal and the data signals are respectively applied to the positive and negative inputs shown in FIG. 12. This polarity reversal ensures that when certain data blocks are selected, the proper logic state is still determined. In still yet another embodiment, the LSA outputs are configured to reverse the data polarity. In another embodiment, opposite data values are written into the selected data blocks. Also, in another exemplary design, the negative input of the LSA shown in FIG. 12 is designed to couple to a reference cell signal regardless of which data block is selected. The positive input is always a memory cell data signal regardless of which data block is selected.

Although the present invention has been discussed with respect to specific embodiments, one of ordinary skill in the art will realize that these embodiments are merely illustrative, and not restrictive, of the invention. For example, although the above description describes an exemplary memory cell as a TCCT-based memory cell, it should be understood that the present invention relates to any memory cell type in general and need not be restricted to use in TCCT memory arrays. For example, Magnetoresistive Random Access Memory ("MRAM"), Ferroelectric Random Access Memory ("FRAM"), SRAM, DRAM, and other memory types can be deployed in the architecture described herein or modified to accommodate the specific memory type. The scope of the invention is to be determined solely by the appended claims.

What is claimed is:

1. A memory architecture comprising:
   at least one thinly capacitively coupled thyristor based memory cell;
   a bit line coupled to the thinly capacitively coupled thyristor based memory cell;
   a word line one line coupled to the thinly capacitively coupled thyristor based memory cell;
   a word line two line coupled to the thinly capacitively coupled thyristor based memory cell;
   a word line one driver coupled to the word line one line;
   a word line two driver coupled to the word line two line;
   a global word line oen select line coupled to the word line one driver to drive the word line one line; and
   a global word line two select line coupled to the word line two driver to drive the work line two line.

2. The memory architecture of claim 1 further comprising a sense amplifier having an input configured to couple to the at least one thinly capacitively coupled thyristor based memory cell.

3. The memory architecture of claim 1 wherein the at least one memory cell includes a gate and a pass transistor, and wherein the word line two line is coupled to the gate and the bit and word line one lines are coupled to the pass transistor.

4. The memory architecture of claim 2 wherein the at least one memory cell includes a gate and a pass transistor, and wherein the word line two line is coupled to the gate and the bit and word line one lines are coupled to the pass transistor.

5. The memory architecture of claim 2 further comprising a second memory cell coupled to the sense amplifier.

6. The memory architecture of claim 5 wherein the second memory cell is a reference cell.

7. The memory architecture of claim 2 wherein another input of the sense amplifier is coupled to a reference.

* * * * *